United States Patent
Davenhall et al.

(10) Patent No.: US 6,846,789 B2
(45) Date of Patent: Jan. 25, 2005

(54) COMPOSITION AND METHOD FOR REMOVING PHOTORESIST MATERIALS FROM ELECTRONIC COMPONENTS

(75) Inventors: Leisa B. Davenhall, Santa Fe, NM (US); James B. Rubin, Los Alamos, NM (US); Craig M. V. Taylor, Jemez Springs, NM (US)

(73) Assignee: The Regents of the University of California, Los Alamos, NM (US)

( * ) Notice: Subject to any disclaimer, the term of this patent is extended or adjusted under 35 U.S.C. 154(b) by 365 days.

(21) Appl. No.: 10/133,709

(22) Filed: Apr. 26, 2002

(65) Prior Publication Data

US 2003/0181343 A1 Sep. 25, 2003

Related U.S. Application Data

(63) Continuation-in-part of application No. 09/621,067, filed on Jul. 21, 2000, now Pat. No. 6,403,544, which is a continuation-in-part of application No. 09/216,211, filed on Dec. 18, 1998, now abandoned.
(60) Provisional application No. 60/079,918, filed on Mar. 30, 1998.

(51) Int. Cl.[7] .......................... C09K 19/52; H01L 21/00; C11D 7/50
(52) U.S. Cl. ........................... 510/285; 8/142; D32/10; 134/2; 134/12; 134/31; 438/745

(58) Field of Search .............................. 510/285, 175, 510/176; 8/142; D32/10; 134/2, 12, 31, 1, 1.3; 438/745; 430/329

(56) References Cited

U.S. PATENT DOCUMENTS

| | | | |
|---|---|---|---|
| 4,992,308 A | 2/1991 | Sunol | 427/297 |
| 5,306,350 A | 4/1994 | Hoy et al. | 134/22.14 |
| 5,377,705 A | 1/1995 | Smith, Jr. et al. | 134/95.3 |
| 5,417,768 A | 5/1995 | Smith, Jr. et al. | 134/10 |
| 5,466,365 A * | 11/1995 | Savastano et al. | 208/309 |
| 5,478,673 A | 12/1995 | Funatsu | 429/197 |
| 5,866,004 A * | 2/1999 | Houck et al. | 210/634 |
| 5,866,005 A | 2/1999 | DeSimone et al. | 210/634 |
| 5,866,305 A | 2/1999 | Chon et al. | 430/331 |
| 5,868,856 A | 2/1999 | Douglas et al. | 134/2 |
| 5,873,948 A | 2/1999 | McCullough et al. | 134/19 |
| 5,908,510 A | 6/1999 | McCullough et al. | 134/2 |
| 6,277,753 B1 | 8/2001 | Mullee et al. | 438/692 |
| 6,306,564 B1 | 10/2001 | Mullee | 430/329 |
| 6,331,487 B2 | 12/2001 | Koch | 438/692 |

* cited by examiner

Primary Examiner—Gregory Webb
(74) Attorney, Agent, or Firm—Samuel L. Borkowsky; Gemma Morrison Bennett

(57) ABSTRACT

Composition and method for removing photoresist materials from electronic components. The composition is a mixture of at least one dense phase fluid and at least one dense phase fluid modifier. The method includes exposing a substrate to at least one pulse of the composition in a supercritical state to remove photoresist materials from the substrate.

14 Claims, 2 Drawing Sheets

COMPOSITION AND METHOD FOR REMOVING PHOTORESIST MATERIALS FROM ELECTRONIC COMPONENTS

This application is a continuation-in-part of application Ser. No. 09/621,067 filed Jul. 21, 2000, now U.S. Pat. No. 6,403,544, which is a continuation-in-part of application Ser. No. 09/216,211 filed Dec. 18, 1998, now abandoned, which claims benefit of provisional application Ser. No. 60/079,918 filed Mar. 30, 1998, all of which are hereby incorporated by reference.

STATEMENT REGARDING FEDERAL RIGHTS

This invention was made with government support under Contract No. W-7405-ENG-36 awarded by the U.S. Department of Energy. The government has certain rights in the invention.

FIELD OF THE INVENTION

This invention relates to a composition of dense phase fluids in combination with dense phase fluid modifiers and to a method for using the composition to remove polymers and photoresist materials from a substrate such as a semiconductor wafer or chip.

BACKGROUND OF THE INVENTION

During the manufacture of integrated circuits, commonly referred to as semiconductor chips or microchips, several iterations of a photolithographic process are used. In this manufacturing process, dielectric, barrier or electrically conducting layers of silicon dioxide, silicon nitride, or metal are deposited upon a substrate such as a silicon or gallium arsenide wafer by thermal oxidation, chemical vapor deposition, sputtering, ion implantation, vacuum evaporation, or similar means. After these layers are deposited, a photoresist material is coated onto the surface of the wafer by, for example, spinning the wafer to distribute liquid photoresist material evenly on the surface of the wafer. Usually the coated wafer is heated in a "soft bake" or prebake step to improve adhesion of the photoresist material to the surface and to remove solvent from the photoresist material.

After the photoresist material is "soft baked", selected portions of the wafer are exposed to high energy light, such as high intensity ultraviolet light, in a desired pattern defined by a photomask. Developing agents are then used to develop the portions of the photoresist material that were exposed to the high-energy light. When the photoresist material is a positive photoresist material, the developed portions are solubilized by the light exposure and then washed away. This leaves some portions of the wafer exposed and other portions coated with dielectric or conducting layer underneath the remaining, unexposed and undeveloped photoresist layer. Conversely, when the photoresist material is a negative photoresist material, the undeveloped portions are selectively removed.

Once the pattern of photoresist material has been established on the wafer, the wafer is "hard baked" to densify and toughen the photoresist material and to further improve adhesion. The exposed substrate and/or barrier material is then etched (removed) by any of several suitable methods, depending upon the materials used to prepare the dielectric or conducting layer; wet chemical etching, dry etching, plasma etching, sputter etching or reactive-ion etching processes, for example, may be used. The etching processes remove barrier material that is unprotected by photoresist material, leaving both portions of bare wafer and portions of wafer having layered coatings of barrier layer and photoresist material that protected the barrier layer underneath from being etched away. The wafer is then treated in an aggressive step to remove the hard baked photoresist material. This has traditionally been done using solvent washes of halogenated hydrocarbons, mixtures of sulfuric acid and hydrogen peroxide, or highly alkaline mixtures of hydroxides and activators. Use of any of these solvent mixtures produces large volumes of undesirable wastes. After the hard-baked photoresist material is removed, the wafer is washed with deionized water to remove all traces of photoresist removal solvents, and treated with isopropyl alcohol to remove any residual water.

This photolithographic process is repeated as many times as needed to produce as many layers of different patterns of dielectric, barrier or conducting layer material upon the substrate as desired. Layers of either positive or negative photoresist material can be used in various combinations on the same wafer.

The solvent washing step, wherein the wafer is washed with halogenated hydrocarbons, mixtures of sulfuric acid and hydrogen peroxide, or highly alkaline mixtures of hydroxides and activators, generates large volumes of waste that must be disposed of at great cost. There is a need for a method and composition for removing photoresist materials from electronic components that reduces the amount of undesirable wastes.

Therefore it is an object of this invention to provide a method of removing photoresist materials during the manufacture of electronic components such as integrated circuits, circuit boards, optical waveguides and flat panel displays.

Another object of the invention is to provide a composition for removing photoresist materials from electronic components.

Another object of the invention is to provide a method for reducing the amount of waste generated during removal of photoresist materials from electronic components.

Another object of the invention is to provide a method for removing photoresist materials from integrated circuit features less than 0.1 microns in size.

Additional objects, advantages and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims. The claims appended hereto are intended to cover all changes and modifications within the spirit and scope thereof.

SUMMARY OF THE INVENTION

To achieve the foregoing and other objects, and in accordance with the purposes of the present invention, as embodied and broadly described herein, the present invention includes a composition for removing photoresist materials and other polymeric coatings from substrates. The composition includes a mixture of at least one dense phase fluid and at least one dense phase fluid modifier. The dense phase fluid modifier has the formula

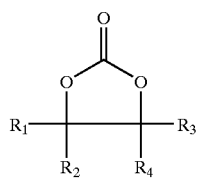

wherein $R_1$, $R_2$, $R_3$, and $R_4$ are independently selected from hydrogen, fluorine, $CH_{(3-x)}F_x$ wherein x is 0, 1, 2, or 3; $C_2H_{(5-x)}F_x$ wherein x is 0, 1, 2, 3, 4, or 5; $C_3H_{(7-x)}F_x$ wherein x is 0, 1, 2, 3, 4, 5, 6, or 7; and $C_4H_{(9-x)}F_x$ wherein x is 0, 1, 2, 3, 4, 5, 6, 7, 8, or 9;
or has the formula

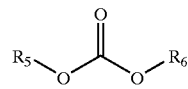

wherein $R_5$ and $R_6$ are independently selected from hydrogen, $CH_{(3-x)}F_x$ wherein x is 0, 1, 2 or 3; $C_2H_{(5-x)}F_x$ wherein x is 0, 1, 2, 3, 4 or 5; $C_3H_{(7-x)}F_x$ wherein x is 0, 1, 2, 3, 4, 5, 6, or 7; and $C_4H_{(9-x)}F_x$ wherein x is 0, 1, 2, 3, 4, 5, 6, 7, 8, or 9;
or has the formula

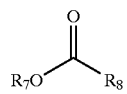

wherein $R_7$ is selected from methyl, ethyl, propyl, butyl, trifluoromethyl, and heptafluoropropyl; and wherein $R_8$ is selected from methyl, ethyl, propyl, butyl, trifluoromethyl, and pentafluoroethyl.

The invention also includes a method for removing photoresist material from a substrate. The method involves exposing a substrate to least one pulsed contact of a supercritical composition to remove photoresist from the substrate. The supercritical composition includes a mixture of at least one dense phase fluid and at least one dense phase fluid modifier. The dense phase fluid modifier may be at least one compound having the formula

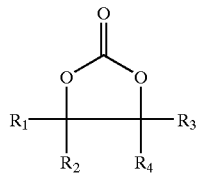

wherein $R_1$, $R_2$, $R_3$, and $R_4$ are independently selected from hydrogen, fluorine, $CH_{(3-x)}F_x$ wherein x is 0, 1, 2, or 3; $C_2H_{(5-x)}F_x$ wherein x is 0, 1, 2, 3, 4, or 5; $C_3H_{(7-x)}F_x$ wherein x is 0, 1, 2, 3, 4, 5, 6, or 7; and $C_4H_{(9-x)}F_x$ wherein x is 0, 1, 2, 3, 4, 5, 6, 7, 8, or 9; or having the formula

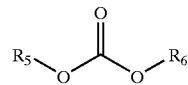

wherein $R_5$ and $R_6$ are independently selected from hydrogen, $CH_{(3-x)}F_x$ wherein x is 0, 1, 2, or 3; $C_2H_{(5-x)}F_x$ wherein x is 0, 1, 2, 3, 4 or 5; $C_3H_{(7-x)}F_x$ wherein x is 0, 1, 2, 3, 4, 5, 6, or 7; and $C_4H_{(9-x)}F_x$ wherein x is 0, 1, 2, 3, 4, 5, 6, 7, 8, or 9; or having the formula

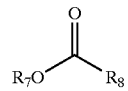

wherein $R_7$ is selected from methyl, ethyl, propyl, butyl, trifluoromethyl, and heptafluoropropyl; and wherein $R_8$ is selected from methyl, ethyl, propyl, butyl, trifluoromethyl, and pentafluoroethyl.

BRIEF DESCRIPTION OF THE DRAWINGS

The accompanying drawings, which are incorporated in and form a part of the specification, illustrate embodiments of the present invention and, together with the description, serve to explain the principles of the invention. In the drawings.

DETAILED DESCRIPTION OF THE INVENTION

Figure 1:
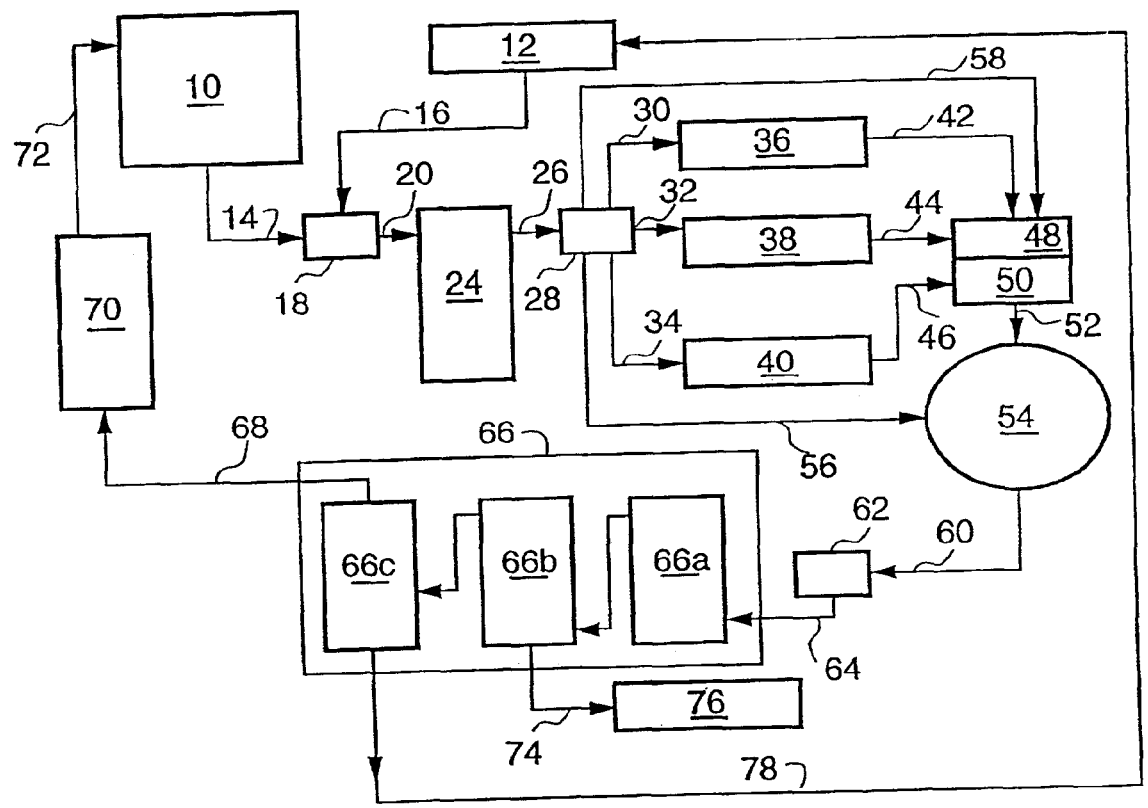
FIG. 1 is a schematic diagram of an invention setup for contacting a substrate having thereon photoresist material with a mixture of dense phase fluid and dense phase fluid modifier in accordance with the invention.

During the photolithographic process, which is used for manufacturing electronic components such as integrated circuits and microelectromechanical systems (MEMS), coatings of photoresist materials are used to establish a pattern of dielectric material, barrier material, and/or conducting material on the substrate. The invention is a composition and method for removing the photoresist materials from the substrate while leaving the pattern of dielectric material, barrier material, and/or conducting material intact. The invention removes photoresist materials that have been, for example, baked, exposed to electromagnetic radiation or electron beams, developed and/or subjected to etching. The invention removes photoresist materials by contact with a supercritical composition of at least one dense phase fluid and at least one dense phase fluid modifier. In the supercritical state, the invention composition behaves both like a liquid (in density) and a gas (in diffusivity).

Dense phase fluids that can be used with the invention include, but are not limited to, carbon dioxide, argon, helium, nitrogen, ethane, methane, propane, butane, and ammonia. Presently most preferred is carbon dioxide because it is non-flammable, non-toxic, has easily achievable supercritical conditions, and is an excellent solvent for Lewis bases.

An amount of dense phase fluid in the range from about 70–99.9 volume percent is generally useful in the invention. More preferable is an amount of dense phase fluid in the range from about 80–99.9 volume percent. Most preferable is an amount of dense phase fluid in the range from about 90–99.8 volume percent.

Preferred dense phase fluid modifiers of the invention have relatively high boiling points, are soluble in the dense phase fluid, and chemically interact effectively at the interfaces of the photoresist material and the substrate by interrupting molecular bonding. Dense phase fluid modifiers of the invention include compounds having the formula

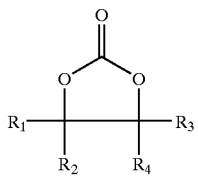

wherein $R_1$, $R_2$, $R_3$, and $R_4$ are independently selected from hydrogen, fluorine, $CH_{(3-x)}F_x$ wherein x is 0, 1, 2, or 3; $C_2H_{(5-x)}F_x$ wherein x is 0, 1, 2, 3, 4, or 5; $C_3H_{(7-x)}F_x$ wherein x is 0, 1, 2, 3, 4, 5, 6, or 7; and $C_4H_{(9-x)}F_x$ wherein x is 0, 1, 2, 3, 4, 5, 6, 7, 8, or 9;

or compounds having the formula

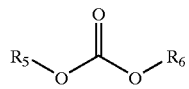

wherein $R_5$ and $R_6$ are independently selected from hydrogen, $CH_{(3-x)}F_x$ wherein x is 0, 1, 2 or 3; $C_2H_{(5-x)}F_x$ wherein x is 0, 1, 2, 3, 4, or 5; $C_3H_{(7-x)}F_x$ wherein x is 0, 1, 2, 3, 4, 5, 6, or 7; and $C_4H_{(9-x)}F_x$ wherein x is 0, 1, 2, 3, 4, 5, 6, 7, 8, or 9;

or compounds having the formula

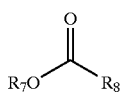

wherein $R_7$ is selected from methyl, ethyl, propyl, butyl, trifluoromethyl, and heptafluoropropyl; and wherein $R_8$ is selected from methyl, ethyl, propyl, butyl, trifluoromethyl, and pentafluoroethyl.

Preferred dense phase fluid modifiers are completely soluble in the selected dense phase fluid; complete solubility facilitates the removal of all modifiers and all dense phase fluid in a single step from the treated substrate. Preferred dense phase fluid modifiers include ethylene carbonate, propylene carbonate, butylene carbonate, and propylene glycol methyl ether acetate. An amount of dense phase fluid modifier in the range from greater than zero to about 30 volume percent is generally useful in the invention. More preferable is an amount of dense phase fluid modifier in the range from about 0.1–20 volume percent. Most preferred is an amount of dense phase fluid modifier in the range from about 0.2–10 volume percent. As the relative amount of modifier is increased and the relative amount of dense phase fluid is decreased, higher and higher temperatures and pressures will be required to provide a composition in the supercritical state.

The composition of the invention is prepared by combining selected amounts of dense phase fluid and dense phase fluid modifier while maintaining sufficient pressure and temperature to keep the resulting mixture in a single supercritical state. A wide range of pressures and temperatures can be used to maintain the components in a supercritical state. These pressures and temperatures depend upon the choice of components. When, for example, carbon dioxide is the dense phase fluid and propylene carbonate is the dense phase fluid modifier a pressure of at least 1080 psi and a temperature of at least 31° C. are required to produce a supercritical fluid.

It is believed that the composition of the invention does not chemically react with transition metals such as copper, silver, or, nickel, with other metals such as aluminum, gallium indium, tin, and lead, or with materials having a low dielectric constant such as silicon-oxygen-carbon compounds (SiOCs). Therefore, the invention composition is not expected to damage electronic components.

Minor amounts of other additives can be used in the invention composition to modify the viscosity, thermal conductivity, polarity and/or critical point of the composition. These other additives include, but are not limited to, propylene glycol methyl ether, dipropylene glycol methyl ether, diethyl carbonate, and isobutylisobutyrate. Argon or hydrogen can be used to enhance thermal conductivity. Ammonia can be used to increase polarity of the invention composition. Water can be added to increase polarity and enhance solubility of the system and thermal transfer.

Generally, temperatures of about 0–300° C. are useful in the practice of the invention to produce a single supercritical state. Generally more preferred are temperatures of about 15–200° C. Most preferred, particularly when using carbon dioxide as the dense phase fluid and propylene carbonate as the dense phase fluid modifier, are temperatures of about 40–100° C.

A substrate having patterned coatings of dielectric, barrier, or conducting material and baked photoresist material can be first contacted with the supercritical invention composition for a soaking period in a high-pressure vessel filled with the composition at a pressure in the range of about 500–10,000 psi. After the soaking period, the pressure is reduced to a lower but still elevated pressure. The lower pressure may or may not result in the temporary loss of the supercritical state. The combination of soaking the substrate the substrate with the supercritical composition at a high pressure and then reducing the pressure to a lower but still elevated pressure is defined herein as a pulse. Preferably, during soaking, the pressure is in the range of about 1,000–6,000 psi and most preferably in the range of about 1,200–3,000 psi. During both the soaking period and the period during which the pressure is lowered, the invention composition removes the photoresist materials from the substrate. After the photoresist is removed, the substrate can be rinsed with, for example, unmodified dense phase fluid, to remove any residual material from the substrate.

Any suitable means of producing pulses of supercritical fluid can be used with the invention. One particular apparatus that provides sequenced pulses of fluid at selected pressures is described in U.S. Pat. No. 6,085,762, which issued Jul. 11, 2000. The apparatus includes reservoirs for the dense phase fluid and the dense phase fluid modifier and valved conduits that connect each reservoir to a pump. The apparatus also includes a conduit with control valves from the pump to one or more ballast tanks. The control valves are able to, sequentially or intermittently, direct a flow of fluid into each of the ballast tanks. The apparatus also includes conduits from each ballast tank to a control valve and to an injection valve that injects fluid from each ballast tank into a high-pressure processing vessel where the substrates are contacted with the supercritical invention composition to remove the photoresist material.

The apparatus may include separator vessels for recycling the invention composition. If the removed photoresist materials are insoluble in the supercritical invention composition, a simple filter can be used to separate the invention composition from the removed insoluble photoresist materials. If the removed photoresist materials are soluble in the supercritical invention composition, a single separator vessel can be used to contain the solution of invention composition and removed soluble photoresist materials. The temperature and pressure can be adjusted until the photoresist material is no longer soluble and precipitates out of the mixture. The remaining dense phase fluid and dense phase fluid modifier can then be recycled. Alternatively, the temperature and pressure may be adjusted to boil off the dense phase fluid, leaving a mixture of the dense phase fluid modifier and photoresist material. The boiled-off fluid can be recondensed to liquid and reused while the remaining mixture of dense phase fluid modifier and photoresist material would be separated.

Preferably, a multi-unit separator vessel is used. In one unit of the multi-unit vessel, the temperature and pressure of the mixture are adjusted to precipitate the photoresist material. Later in another unit, the dense phase fluid is boiled away from the dense phase fluid modifier by reducing the pressure and increasing the temperature. In another unit, dense phase fluid modifier is separated from photoresist material and returned to the dense phase fluid modifier reservoir for reuse, or transported elsewhere for other purposes.

Ballast tanks provide a reliable, ready source of supercritical invention composition. An apparatus with three ballast tanks is shown schematically in FIG. 1. FIG. 1 shows dense phase fluid reservoir 10 and dense phase fluid modifier reservoir 12. Conduit 14 connects dense phase fluid reservoir 10 to control valve 18. Conduit 16 connects dense phase fluid modifier reservoir 12 to control valve 18. Control valve 18 admits selected amounts of dense phase fluid from reservoir 10 and selected amounts of dense phase fluid modifier from reservoir 12 through conduit 20 to high-pressure pump 24. High-pressure pump 24 produces the desired fluid pressure and creates high volume flow.

Substrates to be treated are held in position in high-pressure process vessel 54 by any suitable means. The substrates, for example, can be attached to a shelf that is suspended in high-pressure process vessel 54 by brackets. High-pressure process vessel 54 is isolated and depressurized when positioning wafers therein and removing wafers therefrom. Preferably, the substrates are positioned so that incoming fluid impacts directly onto the photoresist material to be removed from the substrate.

With the substrates in held in position, pump 24 pumps the invention composition from valve 28 through conduit 56 and into high pressure processing vessel 54. High-pressure processing vessel 54 is maintained at sufficiently high temperature and pressure to produce and maintain the supercritical state of the invention composition. The substrates soak in the invention composition for about 0.5–10 minutes. As the substrates soak, high-pressure pump 24 pumps the invention composition through conduit 26 into control valve 28. Valve 28 releases a pre-determined portion of the invention composition into each of three conduits 30, 32 and 34, and control valve 28 can control the pressure of the invention the invention composition released into each of these conduits. Conduits 30, 32 and 34 are connected to ballast tanks 36, 38 and 40, respectively. Preferably, at least one ballast tank is fully pressurized with invention composition while other ballast tanks release invention composition into multiport control valve 48, which injects invention composition through injection valve 50, though conduit 52, and into high-pressure process vessel 54.

Invention composition may be transferred from the ballast tanks to high-pressure process vessel as follows. When invention composition flows from conduit 30 into ballast tank 36, valve 48 stops the flow of invention composition out of ballast tank 36. As ballast 36 pressurizes with invention composition, valve 48 releases invention composition out of either ballast tank 38 or ballast tank 40. Invention composition released from ballast tank 36 flows into conduit 44, though control valve 48, and into injection valve 50, which injects the invention composition into high-pressure process vessel 54. Invention composition from ballast tank 40 is released through conduit 46, into control valve 48, and into injection valve 50 for injection into high-pressure process vessel 54. The pressure in any ballast tank must be higher than the pressure inside high-pressure process vessel 54 for invention composition to flow from ballast tank to vessel 54.

Following the soaking period, control valve 62 is opened to allow invention composition to exit vessel 54 though conduit 60. This reduces the pressure within vessel 54 to a lower but still elevated pressure, such that the remaining invention composition is not necessarily in the supercritical state. Vessel 54 can then be refilled with additional invention composition from any of the ballast tanks to restore the supercritical state within vessel 54 for another soaking period. Afterward, control valve 62 opens again to remove invention composition from vessel 54 and reduce the pressure, as before. These pulses are repeated until the photoresist material is substantially or completely removed from the substrate. The time needed to remove the photoresist depends upon the pressure, temperature, the amount of invention composition removed from vessel 54 during each pulse, the number of pulses, and the invention composition used.

The mixture of invention composition and photoresist materials exits vessel through though valve 62, then through conduit 64 and into a separator vessel, an example of which is three-stage separation unit 66 shown in FIG. 1. Unit 66 includes first section 66a, second section 66b, and third section 66c. Each section is provided with its own heater for adjusting the temperature of that section.

First section 66a filters any undissolved photoresist materials and other particles from the mixture. What remains in solution passes from section 66a to section 66b. The pressure and/or temperature are adjusted in section 66b in order to precipitate dissolved photoresist materials from the invention composition. The invention composition then flows from section 66b into third section 66c. In third section 66c, the pressure and/or temperature are adjusted to separate the dense phase fluid from the dense phase fluid modifier. The pressure and/or temperature within third section 66c is adjusted to vaporize the dense phase fluid of the invention composition into a gas that exits third section 66c, flows through conduit 68, and enters condenser 70 where the gas is liquefied. The resulting liquid flows through conduit 72 and into dense phase fluid reservoir 10 for reuse if desired. Alternatively, the dense phase fluid can be removed from the loop.

Dense phase fluid modifier may be recycled from unit 66 by returning it to reservoir 12 through conduit 78, if desired. The separated photoresist materials exit second section 66b through conduit 74 to collector 76. Alternatively, the mixture of dense phase fluid modifier and photoresist materials can be pumped from unit 66 and removed from the loop for separation at a remote unit. After the photoresist materials are removed from the substrate, the substrate is rinsed by pumping unmodified dense phase fluid from dense phase fluid reservoir 10 through valve 28, through conduit 58, and into multiport control valve 48 for injection into high pressure vessel 54.

The invention composition does not leave a residue of dense phase fluid modifier because the dense phase fluid modifier is completely soluble in the supercritical fluid. Therefore, the invention reduces waste by replacing the waste generating steps of rinsing with deionizing water and subsequent drying with isopropyl alcohol. The invention also reduces waste by replacing the steps of washing the substrate with halogenated hydrocarbons, mixtures of sulfuric acid and hydrogen peroxide, or highly alkaline mixtures of hydroxides and activators. The invention composition is fully compatible with conductive metal deposited during wafer metallizations. Although organic stripping solvents are compatible with most wafer metallizations and substrates, these stripping are hazardous. The acidic and alkaline solutions that are typically used for removing photoresist materials are generally compatible with wafer substrates but corrode metallizations. Plasmas used for removal of photoresist materials can damage pre-fabricated gates and the substrate can oxidize the wafer substrate surface and corrode metallization materials. The invention composition and method avoid these drawbacks. The following examples demonstrate the operability of the invention.

EXAMPLE I

Figure 2:
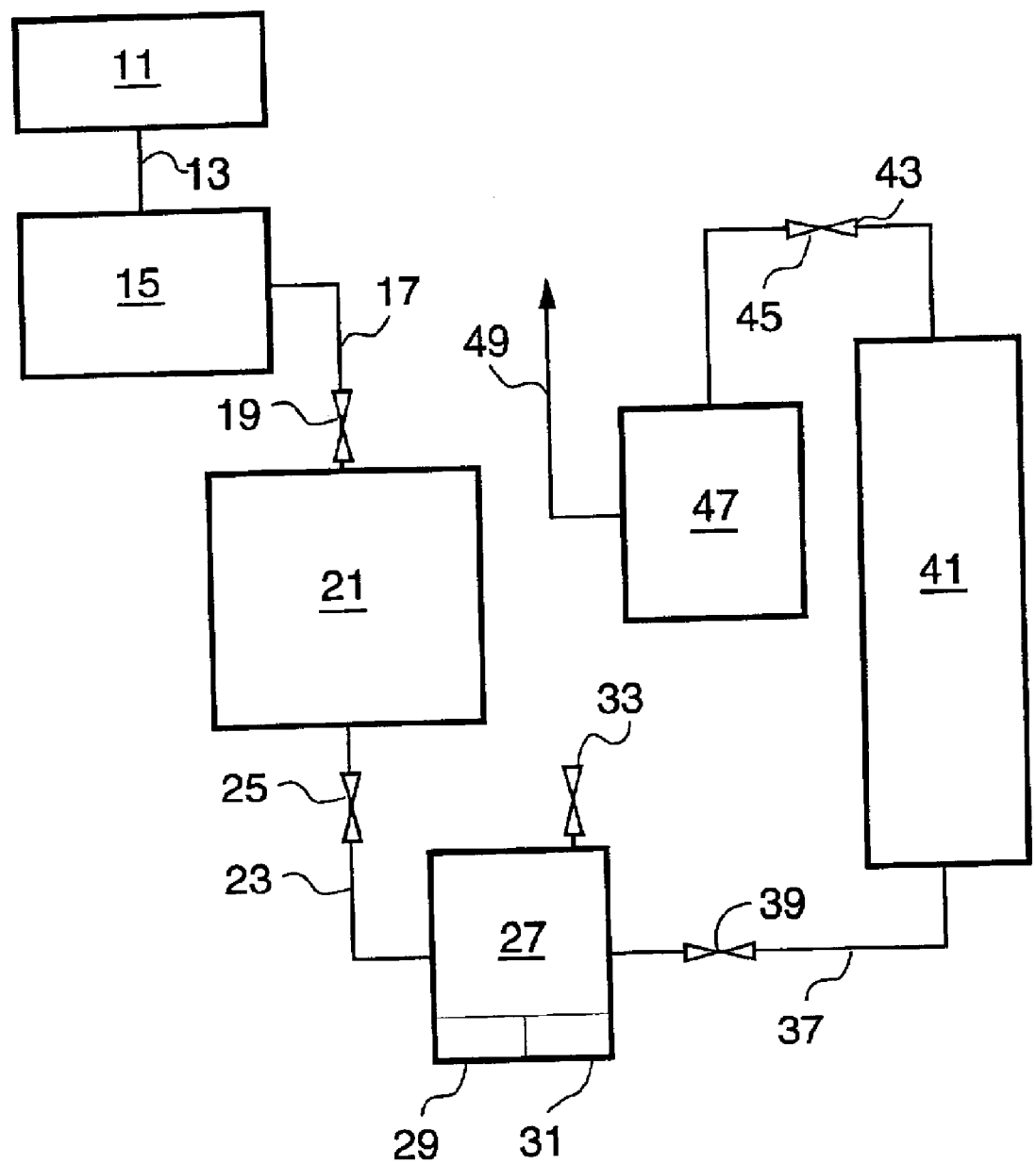
FIG. 2 is a schematic diagram of an equipment setup used to demonstrate operability of the invention.

For making the invention run described in this example, equipment was set up in the manner shown in the schematic of FIG. 2. Carbon dioxide was used as the dense phase fluid and propylene carbonate was used as the dense phase fluid modifier to remove photoresist material from the silicon substrate of a semiconductor chip wafer. A mixture of 5% propylene/95% carbon dioxide by volume was used as feed material for propylene carbonate and carbon dioxide reservoir 11. Conduit 13 connected reservoir 11 to an ISCO™ 260D syringe pump 15. Conduit 17 connected pump 15 to the Whitey™ 304L-HDF4 1000 cc high-pressure sample cylinder that served as ballast tank 21. Conduit 17 included pressure relief valve 19.

On the downstream side of ballast tank 21, valve 25 and ¼" stainless steel conduit 23 connected ballast tank 21 to a DUR-O-LOK™ quick opening high pressure filter housing (C.F. Technologies) that was modified to serve as cleaning vessel 27. The DUR-O-LOK™ quick opening high pressure filter housing was modified by adding pressure relief port 33 and machining the inside with tie-down points to hold the wafers. The modified vessel was recertified to meet A.S.M.E. Code, Sec. VII, Div. 1 standards. The active volume of cleaning vessel 27 was approximately 320 cc.

A positioning fixture made from a stainless steel disc approximately 2 inches in diameter held the wafers in position inside cleaning vessel 27. The positioning fixture was configured to accept a second disc having a wafer mounted to it. Conduit 23 was positioned such that the dense phase fluid composition was injected directly onto the surface of the wafers. High wattage heater 29, thermocouple 31, and pressure relief valve 33 were also connected to cleaning vessel 27.

Conduit 37, fabricated from high pressure, stainless steel rigid tubing and Swagelok™ flexible teflon bore stainless overbraided tubing was used to connect cleaning vessel 27 to surge tank 41. Surge tank 41 had a 2-liter volume and was a modified a high-pressure filter housing available from Autoclave Engineers. Precision micrometer bellows needle valve 39 along conduit 37 vented excess pressure from cleaning vessel 27 while maintaining a supercritical pressure for cleaning vessel 27.

Conduit 43, with valve 45 thereon, connected surge tank 41 to a 5-liter water bubbler 47 that trapped propylene carbonate that was released from surge tank 41. Conduit 49 conducted clean carbon dioxide away from the water bubbler 47 for release into the atmosphere. Water and propylene carbonate were removed from water bubbler 47 as needed.

Before pressurization began for this demonstration run, ballast tank 21 and cleaning vessel 27 were preheated to 50° C. Two variable voltage transformers were used to control separately the temperatures of ballast tank 21 and cleaning vessel 27. High pressure syringe pump 15, ballast tank 21 and cleaning vessel 27 were then filled with an invention composition of carbon dioxide and propylene carbonate to a pressure of about 900 psi in about 2 minutes. Afterward, high-pressure syringe pump 15 introduced additional invention composition to increase the pressure of cleaning vessel 27 and ballast tank 21 to a critical pressure of about 1100 psi. Valve 25 was then closed and pump 15 introduced additional invention composition into ballast tank 21, increasing the pressure therein to approximately 1600 psi. The five minute period during which the pressure was increased to 1600 psi is the soaking step. After pressurizing ballast tank 21 to 1600 psi, valve 25 was opened and additional invention composition flowed into cleaning vessel 27. The pressure in the ballast tank 21 and cleaning vessel 27 was allowed to equilibrate at approximately 1400 psi. After equilibration, micrometer bellows valve 39 was opened for about 1 minute to allow the pressure in ballast tank 21 and in cleaning vessel 27 to drop to 1100 psi. Micrometer bellows valve 39 and valve 25 were closed and high-pressure syringe pump 15 was reactivated to repressurize ballast tank 21 to repeat the above described procedure to provide wafers in cleaning vessel 27 with another pressure pulse. The procedure was repeated a total of three times. After the three pulses, the entire system was depressurized and the special fixture holding the silicon wafer was removed from the cleaning vessel 27 and rinsed with deionized and filtered water. Analysis of the silicon wafer showed that substantially all photoresist material had been removed from the wafer.

EXAMPLE II

A set of runs were made to compare the use of unmodified supercritical carbon dioxide, modifier alone, and combinations of supercritical carbon dioxide and modifier using various temperature, pressure and contact conditions. The compositions and contact conditions of these runs are shown in Table I.

TABLE 1

| Run | Supercritical Components | Type of Photo Resist | Pressure | Temperature | Contact Protocol |
|---|---|---|---|---|---|
| 1 | 100% carbon dioxide | Positive | 5,000 psi | 90° C. | 30 min static, 30 min dynamic in 10 mL vessel |
| 2 | 100% carbon dioxide | Positive | 5,000 psi | 90° C. | 30 min static, 30 min dynamic in 10 mL vessel |
| 3 | None followed by 100% propylene carbonate followed by 100% carbon dioxide | Negative | N/A | 60° C. | 60 min oven bake with no supercritical fluid, followed by 15 min oven bake with propylene carbonate |

TABLE 1-continued

| Run | Supercritical Components | Type of Photo Resist | Pressure | Temperature | Contact Protocol |
|---|---|---|---|---|---|
| 4 | 100% propylene carbonate followed by 100% carbon dioxide | Negative | 5,000 psi | 90° C. | 120 min oven bake with propylene carbonate followed by 30 min oven bake with propylene carbonate |
| 5 | 5% propylene carbonate in carbon dioxide followed by 100% carbon dioxide | Positive | 5,000 psi 3,000 psi | 90° C. 40° C. | 30 min static, 30 min dynamic with 5% propylene carbonate, in 10 mL vessel, 15 min dynamic with 100% carbon dioxide in 60 L vessel |
| 6 | 5% propylene carbonate in carbon dioxide followed by 100% carbon dioxide | Negative | 5,000 psi 4,000 psi | 90° C. 58° C. | 30 min static with 5% propylene carbonate in 10 mL vessel, 40 min dynamic in 60 L vessel |
| 7 | 5% propylene carbonate in carbon dioxide followed by 100% carbon dioxide | Negative | 1,200 psi 3,000 psi | 90° C. 51° C. | 30 min static, 30 min dynamic with 5% propylene carbonate, in 10 mL vessel, 15 min dynamic with 100% carbon dioxide in 60 L vessel |
| 8 | 5% propylene carbonate in carbon dioxide | Negative | 4,000 psi | 40° C. | 30 min static, 30 min dynamic, in 10 mL vessel |
| 9 | 5% propylene carbonate in carbon dioxide | Negative | 4,000 psi | 75° C. | 30 min static, 30 min dynamic, in 10 mL vessel |
| 10 | 5% propylene carbonate in carbon dioxide | Negative | 5,000 psi | 90° C. | 30 min static, 30 min dynamic, in 10 mL vessel |
| 11 | 5% propylene carbonate in carbon dioxide | Negative | 1,200 psi | 90° C. | 30 min static, 30 min dynamic, in 10 mL vessel |
| 12 | 5% propylene carbonate in carbon dioxide | Negative | 1,200 psi | 90° C. | 30 min static, 30 min dynamic, in 10 mL vessel |

Runs 1–4 were comparison runs; Runs 5–12 were invention runs.

Runs 1, 2, and 4–12 were performed using an ISCO™ 260D syringe pump controlled with a series D controller. Runs 5, 6 and 7 utilize a 60-liter SuperScrub™ unit in an additional step.

In Runs 1 and 2, the pump delivered 100% carbon dioxide to an ISCO™ SFX-2-10 supercritical fluid extractor.

In Runs 3 and 4, 100% propylene carbonate then 100% carbon dioxide were sequentially delivered by the pump to the ISCO™ SFX-2-10 supercritical fluid extractor.

In Runs 5, 6 and 7, a mixture of 5% propylene carbonate and 95% carbon dioxide was delivered by the pump to an ISCO™ SFX-2-10 supercritical fluid extractor and then 100% carbon dioxide was delivered by a 60-liter Super-Scrub™ unit in an additional step.

In Runs 8 through 12, a mixture of 5% propylene carbonate and 95% carbon dioxide was delivered by the pump to an ISCO™ SFX-2-10 supercritical fluid extractor.

Under dynamic operation, the exit gas was regulated to a flow of 1.5 mL/min through and ISCO heated restrictor that is controlled by an ISCO™ Restrictor Temperature Controller.

For runs 1, 2, and 5–12, the samples were placed in a 10-mL aluminum cell that was fitted into the ISCO™ SFX-2-10 supercritical fluid extractor. The combination of the 10-ml cell and the extractor was the "cleaning cell". During a typical run the sample was placed in the 10-mL aluminum cell. The cell was positioned inside the extractor, which has been heated to the desired treatment temperature. The cleaning vessel was filled and pressurized with fluid using the ISCO™ 260D syringe pump. After a 30-minute static soaking period, the fluid inside the cleaning vessel was circulated for 30 minutes by opening the exit valve and allowing fluid to flow out at a rate of 1.5 ml/min while the syringe pump added fluid to the cell at the same rate.

The extract was collected in a vial containing a small amount of water. After the treatment was completed, the sample was removed and analyzed for residual photoresist using nuclear reaction analysis.

In Runs 5, 6 and 7 where the photoresist coated wafer was treated first with a mixture of 5% by volume propylene carbonate in carbon dioxide and then with 100% carbon dioxide, the first treatment was performed in the manner described above in an ISCO™ reactor vessel. Then, for treatment of the photoresist-coated wafer with 100% carbon dioxide, a 60-liter capacity Super Scrub™ high-pressure vessel with high-pressure continuous flow pumping system was used.

A special nozzle assembly was designed to apply the supercritical carbon dioxide to the wafer. The nozzle assembly consisted of four individual outputs directed onto the wafer surface from points 90 degrees apart around the diameter of the wafer holder. The nozzle assembly directed the entire carbon dioxide flow directly onto the wafer surface.

The flow volume of the supercritical cabon dioxide was 3.87 liters per minute, which was the equivalent of 500 pounds per hour. The ultimate pressure in the vessel at the end of the application of carbon dioxide was 3,000 psi.

Results of the runs described in Table 1 are shown in Table 2.

TABLE 2

Results of Comparison and Invention Runs

| Run | Results |
|---|---|
| 1 | Resist material appeared unchanged, but wiped off with methyl alcohol |
| 2 | Resist material appeared unchanged, but wiped off with methyl alcohol |
| 3 | After 60 min oven bake and no supercritical fluid, resist would not wipe off; after 15 min oven bake with propylene carbonate, positive resist wiped off, negative resist did not |
| 4 | After 120 min oven bake with propylene carbonate, resist softened; after 30 min dynamic contact with carbon dioxide, resist hardened |
| 5 | After contact with 5% propylene carbonate in carbon dioxide, most of resist wiped off with Chemwipe ™; after 15 min contact with 100% carbon dioxide, propylene carbonate coating was left on wafers |
| 6 | After 30 min contact with 5% propylene carbonate in carbon dioxide, a thin film of resist remained; after 40 mm contact with carbon dioxide, a thin film of resist remained |

TABLE 2-continued

Results of Comparison and Invention Runs

| Run | Results |
|---|---|
| 7 | After 30 min static and 30 min dynamic contact with 5% propylene carbonate in carbon dioxide, positive resist softened in propylene carbonate, negative resist did not; after 15 min dynamic contact with 100% carbon dioxide, a thin film of resist still remained and hardened upon cooling |
| 8 | After 30 min static and 30 min dynamic contact with 5% propylene carbonate in carbon dioxide, there was slight etching of resist |
| 9 | After 30 min static and 30 min dynamic contact with 5% propylene carbonate in carbon dioxide, there was increased bubbling of resist |
| 10 | After 30 min static and 30 min dynamic contact with 5% propylene carbonate in carbon dioxide, the surface of the resist was dulled, resist wiped off with a cloth |
| 11 | After 30 min static and 30 min dynamic contact with 5% propylene carbonate in carbon dioxide, the resist wiped off easily |
| 12 | After 30 min static and 30 min dynamic contact with 5% propylene carbonate in carbon dioxide; the resist wiped off easily |

The results of Table 2 show that the invention composition removes photoresist materials from semiconductor substrate wafers. Runs 1 and 2 made with only carbon dioxide and Run 3 made with only propylene carbonate demonstrate that either of the invention composition components alone will not be successful in facilitating removal of the photoresist material.

While the compositions, processes and articles of manufacture of this invention have been described in detail for the purpose of illustration, the inventive compositions, processes and articles are not to be construed as limited thereby. The claims of this patent are intended to cover all changes and modifications within the spirit and scope thereof.

INDUSTRIAL APPLICABILITY

The invention composition and method can be used for removing photoresist materials from both metallized and nonmetallized substrates during the manufacture of electronic parts, particularly integrated circuits, MEMs, and plasma displays. The invention composition and method can also be used in other manufacturing processes requiring photolithography, such as the production of optical waveguides and flat-panel displays.

What is claimed is:

1. A composition for removing photoresist materials and other plastics from substrates, said composition comprising a mixture of at least one dense phase fluid and at least one dense phase fluid modifier, wherein said dense fluid modifier has the formula

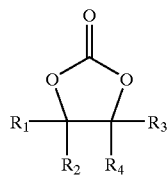

wherein $R_1$, $R_2$, $R_3$, and $R_4$ are independently selected from hydrogen, fluorine, $CH_{(3-x)}F_x$ wherein x is 0, 1, 2, or 3; $C_2H_{(5-x)}F_x$ wherein x is 0, 1, 2, 3, 4, or 5; $C_3H_{(7-x)}F_x$ wherein x is 0, 1, 2, 3, 4, 5, 6, or 7; and $C_4H_{(9-x)}F_x$ wherein x is 0, 1, 2, 3, 4, 5, 6, 7, 8, or 9;

or wherein said dense phase fluid modifier has the formula

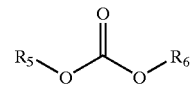

wherein $R_5$ and $R_6$ are independently selected from hydrogen, $CH_{(3-x)}F_x$ wherein x is 0, 1, 2, or 3; $C_2H_{(5-x)}F_x$ wherein x is 0, 1, 2, 3, 4 or 5; $C_3H_{(7-x)}F_x$ wherein x is 0,1, 2, 3, 4, 5, 6, or 7; and $C_4H_{(9-x)}F_x$ wherein x is 0, 1, 2, 3, 4, 5, 6, 7, 8, or 9;

or wherein said dense phase fluid modifier has the formula

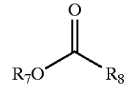

wherein $R_7$ is selected from methyl, ethyl, propyl, butyl, trifluoromethyl, and heptafluoropropyl; and wherein $R_8$ is selected from methyl, ethyl, propyl, butyl, trifluoromethyl, and pentafluoroethyl, with the proviso that x must be greater than zero when the at least one dense phase fluid is carbon dioxide.

2. The composition of claim 1, wherein said composition comprises at least one dense phase fluid selected from the group consisting of carbon dioxide, argon, helium, nitrogen, ethane, methane, propane, butane, and ammonia.

3. The composition of claim 1, wherein said dense phase fluid modifier is present in an amount in the range of from greater than 0 percent to about 30 percent, based on total volume of said composition.

4. The composition of claim 1, wherein said dense phase fluid modifier is present in an amount in the range from 0.1 percent to about 20 percent, based on total volume of said composition.

5. The composition of claim 1, wherein said dense phase fluid modifier is present in an amount in the range from 0.2 percent to about 10 percent, based on total volume of said composition.

6. The composition of claim 1, wherein said composition is at a temperature of about 0–300° C. and a pressure of about 500–10,500 psi.

7. The composition of claim 1, wherein said composition is at a temperature of about 15–200° C. and a pressure of about 1,000–6,000 psi.

8. The composition of claim 1 wherein said composition is at a temperature of about 40–100° C. and a pressure of about 1,200–3,000 psi.

9. A method for removing photoresist material from a substrate comprising exposing a substrate to least one pulse of a supercritical composition, the supercritical composition comprising a mixture of at least one dense phase fluid and at least one dense phase fluid modifier, wherein said dense fluid modifier has the formula

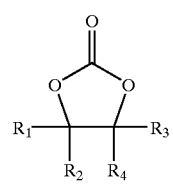

wherein $R_1$, $R_2$, $R_3$, and $R_4$ are independently selected from hydrogen, fluorine, $CH_{(3-x)}F_x$ wherein x is 0, 1, 2, or 3; $C_2H_{(5-x)}F_x$ wherein x is 0, 1, 2, 3, 4, or 5; $C_3H_{(7-x)}F_x$ wherein x is 0, 1, 2, 3, 4, 5, 6, or 7; and $C_4H_{(9-x)}F_x$ wherein x is 0, 1, 2, 3, 4, 5, 6, 7, 8, or 9;

or wherein said dense phase fluid modifier has the formula

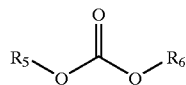

wherein $R_5$ and $R_6$ are independently selected from hydrogen, $CH_{(3-x)}F_x$ wherein x is 0, 1, 2, or 3; $C_2H_{(5-x)}F_x$ wherein x is 0, 1, 2, 3, 4 or 5; $C_3H_{(7-x)}F_x$ wherein x is 0, 1, 2, 3, 4, 5, 6, or 7; and $C_4H_{(9-x)}F_x$ wherein x is 0, 1, 2, 3, 4, 5, 6, 7, 8, or 9;

or wherein said dense phase fluid modifier has the formula

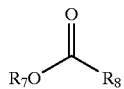

wherein $R_7$ is selected from methyl, ethyl, propyl, butyl, trifluoromethyl, and heptafluoropropyl; and wherein $R_8$ is selected from methyl, ethyl, propyl, butyl, trifluoromethyl, and pentafluoroethyl.

10. The method of claim 9, wherein said pulse comprises:
(a) contacting the substrate with a supercritical composition at a temperature of about 0–300° C. and a pressure of about 500–10,500 psi; and
(b) reducing the pressure.

11. The method of claim 10, wherein said pulse comprises:
(a) contacting the substrate with a supercritical composition at a temperature of about 15–200° C. and a pressure of about 1000–6000 psi; and
(b) reducing the pressure.

12. The method of claim 11, wherein said pulse comprises:
(a) contacting the substrate with a supercritical composition at a temperature of about 40–100° C. and a pressure of about 1200–3000 psi; and
(b) reducing the pressure.

13. The method of claim 12, wherein said pulsed contact is repeated until substantially all photoresist material is removed from the substrate.

14. The method of claim 9, wherein said at least one dense phase fluid is selected from the group consisting of carbon dioxide, argon, helium, nitrogen, ethane, methane, propane, butane, and ammonia.

* * * * *